United States Patent
Aziz et al.

(10) Patent No.: US 7,728,517 B2
(45) Date of Patent: *Jun. 1, 2010

(54) INTERMEDIATE ELECTRODES FOR STACKED OLEDS

(75) Inventors: Hany Aziz, Oakville (CA); Nemania Stefanovic, Toronto (CA); Jennifer A. Coggan, Cambridge (CA); Zoran D. Popovic, Mississauga (CA)

(73) Assignee: LG Display Co., Ltd., Seoul (KR)

( * ) Notice: Subject to any disclaimer, the term of this patent is extended or adjusted under 35 U.S.C. 154(b) by 582 days.

This patent is subject to a terminal disclaimer.

(21) Appl. No.: 11/133,978

(22) Filed: May 20, 2005

(65) Prior Publication Data

US 2006/0263629 A1 Nov. 23, 2006

(51) Int. Cl.
*H01L 51/50* (2006.01)
(52) U.S. Cl. .............. 313/506; 313/503; 313/504; 428/690; 428/917; 257/E51.019
(58) Field of Classification Search .......... 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | |
|---|---|---|---|
| 2,823,905 A | 2/1958 | Brown | |
| 3,172,862 A | 3/1965 | Gurnee et al. | |
| 3,598,644 A | 8/1971 | Goffe et al. | |
| 4,084,966 A | 4/1978 | Haas et al. | |
| 4,287,449 A | 9/1981 | Takeda et al. | |
| 4,356,429 A | 10/1982 | Tang | |
| 4,539,507 A | 9/1985 | VanSlyke et al. | |
| 4,652,794 A | 3/1987 | Waite et al. | |
| 4,665,115 A | 5/1987 | Lundberg et al. | |
| 4,720,432 A | 1/1988 | VanSlyke et al. | |
| 4,769,292 A | 9/1988 | Tang et al. | |
| 4,885,211 A | 12/1989 | Tang et al. | |
| 5,049,780 A | 9/1991 | Dobrowolski et al. | |
| 5,059,861 A | 10/1991 | Littman et al. | |
| 5,141,671 A | 8/1992 | Bryan et al. | |
| 5,150,006 A | 9/1992 | Van Slyke et al. | |
| 5,151,629 A | 9/1992 | VanSlyke | |
| 5,227,252 A | 7/1993 | Murayama et al. | |
| 5,247,190 A | 9/1993 | Friend et al. | |
| 5,276,381 A | 1/1994 | Wakimoto et al. | |
| 5,409,783 A | 4/1995 | Tang et al. | |
| 5,429,884 A | 7/1995 | Namiki et al. | |
| 5,457,565 A | 10/1995 | Namiki et al. | |
| 5,516,577 A | 5/1996 | Matsuura et al. | |
| 5,593,788 A | 1/1997 | Shi et al. | |
| 5,601,903 A | 2/1997 | Fujii et al. | |
| 5,608,287 A | 3/1997 | Hung et al. | |
| 5,703,436 A | 12/1997 | Forrest et al. | |
| 5,707,745 A | 1/1998 | Forrest et al. | |
| 5,719,467 A | 2/1998 | Antoniadis et al. | |
| 5,728,801 A | 3/1998 | Wu et al. | |
| 5,739,635 A | 4/1998 | Wakimoto | |
| 5,776,622 A | 7/1998 | Hung et al. | |
| 5,837,391 A * | 11/1998 | Utsugi | 428/690 |
| 5,846,666 A | 12/1998 | Hu et al. | |
| 5,853,905 A | 12/1998 | So et al. | |
| 5,925,472 A | 7/1999 | Hu et al. | |
| 5,925,980 A | 7/1999 | So et al. | |
| 5,935,720 A | 8/1999 | Chen et al. | |
| 5,935,721 A | 8/1999 | Shi et al. | |
| 5,942,340 A | 8/1999 | Hu et al. | |
| 5,952,115 A | 9/1999 | Hu et al. | |
| 5,955,836 A | 9/1999 | Boerner et al. | |
| 5,972,247 A | 10/1999 | Shi et al. | |
| 6,013,384 A | 1/2000 | Kido et al. | |
| 6,023,073 A | 2/2000 | Strite | |
| 6,028,327 A | 2/2000 | Mizoguchi et al. | |
| 6,057,048 A | 5/2000 | Hu et al. | |
| 6,105,202 A | 8/2000 | Grasso et al. | |
| 6,107,734 A | 8/2000 | Tanaka et al. | |
| 6,130,001 A | 10/2000 | Shi et al. | |
| 6,203,073 B1 | 3/2001 | Sata et al. | |
| 6,225,467 B1 | 5/2001 | Esteghamatian et al. | |

(Continued)

FOREIGN PATENT DOCUMENTS

| | | |
|---|---|---|
| EP | 09 77 287 A2 | 2/2000 |
| EP | 09 772 88 A2 | 2/2000 |
| EP | 1 009 044 A2 | 6/2000 |
| EP | 1 017 118 | 7/2000 |
| EP | 1 029 832 A1 | 8/2000 |

(Continued)

OTHER PUBLICATIONS

Endo et al., "Organic Electroluminescent Devices with a Vacuum-Deposited Lewis-Acid-Doped Hole-Injecting Layer", Japanese Journal of Applied Physics, vol. 41, pp. L358-L360 (Mar. 2002).

Day et al., "The use of charge transfer interlayers to control hole injection in molecular organic light emitting diodes", Thin Solid Films, vol. 410, pp. 159-166 (Mar. 2002).

Gardin et al., "Light-Absorption Phenomena in Novel Low-Reflectance Cathodes for Organic Light-Emitting Devices Utilizing Metal-Organic Mixtures", Advanced Materials, vol. 15, No. 23, pp. 2021-2024 (Dec. 2003).

(Continued)

*Primary Examiner*—Marie R. Yamnitzky
(74) *Attorney, Agent, or Firm*—McKenna Long & Aldridge LLP (57) ABSTRACT

A stacked OLED includes a first electrode, a second electrode, a plurality of luminescent regions disposed between the first and second electrodes, and an intermediate electrode disposed between successive luminescent regions. At least one intermediate electrode comprise a metal-organic mixed layer disposed between a first charge injecting layer and a second charge injecting layer.

15 Claims, 6 Drawing Sheets

U.S. PATENT DOCUMENTS

| | | | |
|---|---|---|---|
| 6,229,012 B1 | 5/2001 | Hu et al. | |
| 6,274,980 B1 | 8/2001 | Burrows et al. | |
| 6,303,250 B1 | 10/2001 | Watanabe et al. | |
| 6,392,250 B1 | 5/2002 | Aziz et al. | |
| 6,392,339 B1 | 5/2002 | Aziz et al. | |
| 6,423,429 B2 | 7/2002 | Kido et al. | |
| 6,437,123 B1 | 8/2002 | Bock et al. | |
| 6,465,115 B2 | 10/2002 | Shi et al. | |
| 6,479,172 B2 | 11/2002 | Hu et al. | |
| 6,562,485 B2 | 5/2003 | Hu et al. | |
| 6,565,996 B2 | 5/2003 | Hatwar et al. | |
| 6,614,175 B2 | 9/2003 | Aziz et al. | |
| 6,717,358 B1 | 4/2004 | Liao et al. | |
| 6,734,625 B2 | 5/2004 | Vong et al. | |
| 6,737,177 B2 | 5/2004 | Hor et al. | |
| 6,740,429 B2 | 5/2004 | Aziz et al. | |
| 6,750,609 B2 | 6/2004 | Aziz et al. | |
| 6,753,098 B2 | 6/2004 | Aziz et al. | |
| 6,759,146 B2 | 7/2004 | Aziz et al. | |
| 6,765,348 B2 | 7/2004 | Aziz et al. | |
| 6,773,830 B2 | 8/2004 | Aziz et al. | |
| 6,821,643 B1 | 11/2004 | Hu et al. | |
| 6,841,932 B2 | 1/2005 | Aziz et al. | |
| 7,083,490 B2 | 8/2006 | Mueller et al. | |
| 7,211,948 B2 | 5/2007 | Liao et al | |
| 7,288,887 B2 | 10/2007 | Aziz et al. | |
| 7,291,404 B2 | 11/2007 | Aziz et al. | |
| 7,351,999 B2 | 4/2008 | Li | |
| 2002/0037398 A1 | 3/2002 | Tofuku et al. | |
| 2002/0121860 A1 | 9/2002 | Seo et al. | |
| 2002/0135296 A1 | 9/2002 | Aziz et al. | |
| 2002/0145380 A1 | 10/2002 | Aziz et al. | |
| 2002/0180349 A1 | 12/2002 | Aziz et al. | |
| 2003/0071565 A1 | 4/2003 | Hatwar et al. | |
| 2003/0116772 A1 | 6/2003 | Yamazaki et al. | |
| 2003/0134146 A1 | 7/2003 | Aziz et al. | |
| 2003/0189401 A1 | 10/2003 | Kido et al. | |
| 2003/0230974 A1 | 12/2003 | Chang et al. | |
| 2003/0234609 A1 | 12/2003 | Aziz et al. | |
| 2004/0004433 A1 | 1/2004 | Lamansky et al. | |
| 2004/0009418 A1 | 1/2004 | Main et al. | |
| 2004/0018383 A1 | 1/2004 | Aziz et al. | |
| 2004/0027059 A1 | 2/2004 | Tsutsui | |
| 2004/0227460 A1* | 11/2004 | Liao et al. | 313/506 |
| 2004/0262615 A1 | 12/2004 | Cok | |
| 2005/0011240 A1 | 1/2005 | Huang et al. | |
| 2005/0064235 A1 | 3/2005 | Liao et al. | |
| 2005/0100760 A1 | 5/2005 | Yokoyama | |
| 2005/0112400 A1 | 5/2005 | Seo et al. | |
| 2005/0140275 A1 | 6/2005 | Park | |
| 2005/0175857 A1 | 8/2005 | Coggan et al. | |
| 2006/0105202 A1 | 5/2006 | Kitamura | |
| 2006/0139516 A1 | 6/2006 | Park | |
| 2006/0139893 A1 | 6/2006 | Yoshimura et al. | |
| 2006/0194076 A1 | 8/2006 | Nariyuki | |
| 2006/0251919 A1 | 11/2006 | Aziz et al. | |
| 2006/0251920 A1* | 11/2006 | Aziz et al. | 428/690 |
| 2006/0261727 A1 | 11/2006 | Aziz et al. | |
| 2006/0261731 A1 | 11/2006 | Aziz et al. | |
| 2006/0263593 A1 | 11/2006 | Aziz et al. | |
| 2006/0263628 A1 | 11/2006 | Aziz et al. | |
| 2006/0263629 A1 | 11/2006 | Aziz et al. | |
| 2006/0265278 A1 | 11/2006 | DiMeo | |

FOREIGN PATENT DOCUMENTS

| | | |
|---|---|---|
| EP | 1 160 890 A2 | 12/2001 |
| EP | 1 167 488 | 1/2002 |
| EP | 1 311 139 A1 | 5/2003 |
| EP | 1 339 112 | 8/2003 |
| EP | 1 624 503 A2 | 2/2006 |
| EP | 1 624 504 A2 | 2/2006 |
| EP | 1 010 359 B1 | 4/2006 |
| JP | 04-230997 | 8/1992 |
| JP | 06-176870 | 6/1994 |
| JP | 8-222374 A | 8/1996 |
| JP | 09-188875 | 7/1997 |
| JP | 10-316904 A | 12/1998 |
| JP | 11-312584 | 11/1999 |
| JP | 11-329749 | 11/1999 |
| JP | 2002-055203 A | 2/2002 |
| JP | 2003-045676 | 2/2003 |
| JP | 2003-086381 | 3/2003 |
| JP | 2003-151777 | 5/2003 |
| JP | 2004-039617 | 2/2004 |
| JP | 2004-095546 | 3/2004 |
| JP | 2004-139981 | 5/2004 |
| JP | 2004-317897 A | 11/2004 |
| JP | 2005-070574 | 3/2005 |
| JP | 2005-072012 | 3/2005 |
| JP | 2006-173550 | 6/2006 |
| JP | 2006-210845 | 8/2006 |
| WO | WO 97/33296 | 9/1997 |
| WO | WO 98/41065 A1 | 9/1998 |
| WO | WO 01/06816 A1 | 1/2001 |
| WO | WO 01/08240 A1 | 2/2001 |
| WO | WO 03/055275 | 7/2003 |
| WO | WO 03/088718 A1 | 10/2003 |
| WO | WO/2004/068911 | 8/2004 |
| WO | WO 2005/037954 | 4/2005 |
| WO | WO 2006/033472 A1 | 3/2006 |
| WO | WO 2006/038573 A1 | 4/2006 |
| WO | WO 2006/076092 A1 | 7/2006 |

OTHER PUBLICATIONS

Hyun-Ouk Ha et al., "Improving the efficiency of organic electroluminescent devices by introducing an electron-accepting and thermally stable polymer", Optical Materials, vol. 21, pp. 165-168 (2002).

Liu et al., "Development of highly stable organic electroluminescent devices with a doped co-host emitter system", Current Applied Physics 5, pp. 218-221 (2005).

Aziz et al., "Reduced reflectance cathode for organic light-emitting devices using metalorganic mixtures", Applied Physics Letters, vol. 83, No. 1, pp. 186-188 (2003).

Welying Gao; Controlled p doping of the hole-transport molecular material N,N'=diphenyl-N,N'-bis(1-naphthyl)-1,1'-biphenyl-4,4'-diamine with Terafluorotetracyanoquinodimethane, Journal of Applied Physics, vol. 94, No. 1 (Jul. 1, 2003), pp. 359-366.

H. Michelle Grandin et al.; Light-Absorption Phenomena in Novel Low-Reflective Cathodes for Organic Light-Emitting Devices Utilizing Metal-Organic Mixtures; Advanced Materials, 2003, 15, No. 23; pp. 2021-2024.

Choong et al.; "Organic Light Emitting Diodes With a Bipolar Transport Layer"; Applied Physics Letters; vol. 75, No. 2, Jul. 12, 1999, pp. 172-174.

Matsumoto, Toshio et al., Multiphoton Emission OLED: Structure and Property, IDW'03; Dec. 2003, pp. 1285-1288.

A. Gyoutoku et al., "An Organic Electroluminescent Dot-Matrix Display Using Carbon Underlayer", Synthetic Metals, vol. 91, pp. 73-75 (1997).

Baldo et al., "Highly efficient phosphorescent emission from organic electroluminescent devices," Nature, vol. 395, pp. 151-154 (1998).

Bernius et al., "Developmental Progress of Electroluminescent Polymeric Materials and Devices" Proceedings of SPIE Conference on Organic Light Emitting Materials and Devices III, Denver, Colo., vol. 3797, p. 129-137 (Jul. 1999).

Carter et al., "*Polymeric anodes for improved polymer light-emitting diode performance*", Appl. Phys. Lett. 70 (16), pp. 2067-2069 (Apr. 21, 1997).

Chengfeng Qiu et al., Comparative Study of Metal or Oxide Capped Indium-Tin Oxide Anodes for Organic Light-Emitting Diodes, Journal of Applied Physics, vol. 93, No. 6 pp. 3253-3257 (Mar. 15, 2003).

Chengfeng Qiu et al., "Praseodymium Oxide Coated Anode for Organic Light-Emitting Diode", Applied Physics Letters, vol. 80, No. 19, pp. 3485-3487 (May 13, 2002).

Chieh-Wei Chen et al., "Top-Emitting Organic Light-Emitting Devices Using Surface-Modified Ag Anode," Applied Physics Letters, vol. 83, No. 25, pp. 5127-5129 (Dec. 22, 2003).

Hongjin Jiang et al., "Improvement of Organic Light-Emitting Diodes Performance by the Insertion of a $Si_3N_4$ Layer", Thin Solid Films, vol. 363, pp. 25-28 (2000).

I-Min Chan et al., "Enhanced Hole Injections in Organic Light-Emitting Devices by Depositing Nickel Oxide on Indium Tin Oxide Anode," Applied Physics Letters, vol. 81, No. 10, pp. 1899-1901 (Sep. 2, 2002).

Kido et al., "White-Light-Emitting Organic Electroluminescent Device Using Lanthanide Complexes," Jpn. J. Appl. Phys., vol. 35, pp. L394-L396 (1996).

Kim et al., "*Anode material based on Zr-doped ZnO thin films for organic light-emitting diodes*", Appl. Phys. Lett., vol. 83, No. 18, pp. 3809-3811 (Nov. 3, 2003).

Kim et al., "*Molecular organic light-emitting diodes using highly conducting polymers as anodes*", Appl. Phys. Lett., vol. 80 No. 20, pp. 3844-3846 (May 20, 2002).

L.S. Hung et al., "Anode Modification in Organic Light-Emitting Diodes by Low-Frequency Plasma Polymerization of CHF3", Applied Physics Letters, vol. 78, No. 5, pp. 673-675 (Jan. 29, 2001).

S. A. VanSlyke et al., "Organic Electroluminescent Devices with Improved Stability", Applied Physics Letters, vol. 69, No. 15, pp. 2160-2162 (Oct. 7, 1996).

S. Karg et al., "Increased Brightness and Lifetime of Polymer Light Emitting Diodes with Polyanilne Anodes", Synthetic Metals, vol. 80, pp. 111-117 (1996).

Soo-Jin Chua et al., "Stabilization of Electrode Migration in Polymer Electroluminescent Devices", Applied Physics Letters, vol. 81, No. 6, pp. 1119-1121 (Aug. 5, 2002).

Wenping Hu et al. "Lowering of Operational Voltage of Organic Electroluminescent Devices by Coating Indium Tin Oxide Electrodes with a Thin $CuO_x$ Layer", Applied Physics Letters, vol. 80, No. 15, pp. 2640-2641 (Apr. 15, 2002).

Yulong Shen et al., "Modification of Indium Tin Oxide for Improved Hole Injection in Organic Light Emitting Diodes," Advanced Materials, vol. 13, No. 16 pp. 1234-1238 (Aug. 16, 2001).

Z.B. Deng et al., "Enhanced Brightness and Efficiency in Organic Electroluminescent Devices Using $SiO_2$ Buffer Layers", Applied Physics Letters, vol. 74, No. 15, pp. 2227-2229 (Apr. 12, 1999).

Zugang et al., "*Organic thin film electroluminescent devices with ZnO:Al as the anode*", J. Phys.: Condens, Matter 8, pp. 3221-3228 (1996).

J. Blochwitz et al., "Non-Polymeric OLEDs with a Doped Amorphous Hole Transport Layer and Operating Voltages Down to 3.2 V to Achieve 100 cd/m2", Synthetic Metals, 2002, vol. 127; pp. 169-173.

* cited by examiner

INTERMEDIATE ELECTRODES FOR STACKED OLEDS

INCORPORATION BY REFERENCE

Co-pending application Ser. No. 11/133,975, published as US 2006/0261731, the entire disclosure of which is incorporated herein by reference, describes a stacked OLED configuration that includes at least one luminescent region comprising a mixture of a hole transport material, an electron transport material, and optionally a dopant, one of which is an emitter. Co-pending application Ser. No. 11/133,977, published as US 2006/0263628, the disclosure of which is incorporated herein by reference in its entirety, describes anodes suitable for a display device, such as an OLED, comprising a metal-organic mixed layer and an electron-accepting material.

BACKGROUND

The present disclosure relates, in various exemplary embodiments, to organic light emitting devices (OLEDs). In particular, the present disclosure relates to stacked OLED configurations.

Organic light emitting devices (OLEDs) represent a promising technology for display applications. A typical organic light emitting device includes a first electrode; a luminescent region comprising one or more electroluminescent organic material(s); and a second electrode; wherein one of the first electrode and the second electrode functions as a hole injecting anode, and the other electrode functions as an electron injecting cathode; and wherein one of the first electrode and the second electrode is a front electrode, and the other electrode is a back electrode. The front electrode is transparent (or at least partially transparent) while the back electrode is usually highly reflective to light. When a voltage is applied across the first and second electrodes, light is emitted from the luminescent region and through the transparent front electrode.

It is sometimes desirable to laminate two or more individual OLEDs in a stacked configuration to form a stacked OLED. Stacked OLED configurations include intermediate electrodes disposed between adjacent luminescent regions. That is, the stacked OLED includes a plurality of individual OLEDs which are defined by a luminescent region disposed between two electrodes. A top electrode of one individual OLED in the stack also functions as a bottom electrode of another OLED in the stack. Successive luminescent regions share an intermediate electrode.

Stacked OLEDs may emit different colors such that a true color pixel is formed from which any color may be emitted. For example, Burrows et al. disclose in *Appl. Phys. Lett.* 69, 2959 (1996) individual OLEDs with red, green, or blue emissions stacked to form color-tunable vertically integrated pixels.

Stacked, monochromatic OLEDs are also possible such as demonstrated by Matsumoto et al. (*SID 03 Digest*, 979 (2003)). Stacked, monochromatic OLEDs potentially provide an OLED configuration having high electroluminescence efficiency.

The intermediate electrodes are typically transparent. Additionally, the intermediate electrodes are often required to act as electron injecting contacts on one side and as hole injecting contacts on the other side. To exhibit all the features required in the intermediate electrodes, the intermediate electrodes are typically made of multiple layers and from materials, e.g., ITO, $V_2O_5$, that are hard to deposit via thermal vapor deposition processes. Consequently, fabricating stacked OLEDs requires additional, more aggressive techniques, such as, for example, sputtering. The required additional, more aggressive deposition techniques increases the costs of fabricating the OLEDs and also increases the risk of damaging the other more fragile organic layers of the stacked OLED.

Therefore, there is a need to provide an intermediate electrode composition or configuration that allows for a stacked OLED to exhibit the advantages of existing stacked OLED configurations. There is also a need to provide an intermediate electrode having a light absorbing capability. There is also a need to provide an intermediate electrode composition or configuration suitable for use in a stacked OLED that is amenable to physical vapor deposition processing.

BRIEF DESCRIPTION

The present disclosure relates, in various embodiments thereof, to a stacked OLED comprising a first electrode; a second electrode; a plurality of luminescent regions disposed between the first and second electrodes; and one or more intermediate electrodes, an intermediate electrode being disposed between successive luminescent regions, wherein at least one of the one or more intermediate electrodes is a metal-organic mixed layer electrode comprising a first charge injecting layer, a second charge injecting layer, and a metal-organic mixed layer disposed between the first and second charge injecting layers.

Additionally, the present disclosure relates, in various embodiments thereof, to a stacked OLED comprising an anode, a cathode; a plurality of luminescent regions disposed between the anode and the cathode; and an intermediate electrode disposed between successive luminescent regions, at least one intermediate electrode independently comprising i) a hole injecting layer, ii) an electron injecting layer, and iii) a metal-organic mixed layer disposed between the hole injecting layer and the electron injecting layer.

These and other non-limiting features and characteristics are more particularly described below.

BRIEF DESCRIPTION OF THE DRAWINGS

The following is a brief description of the drawings, which are presented for the purpose of illustrating exemplary embodiments disclosed herein and not for the purpose of limiting the same.

DETAILED DESCRIPTION

The present disclosure relates to stacked OLED configurations. Stacked OLED configurations in accordance with the present disclosure comprise a substrate, a first electrode, a second electrode, a plurality of luminescent regions disposed between the first and second electrodes, and one or more intermediate electrodes, the intermediate electrodes being disposed between successive luminescent regions. At least one of the intermediate electrodes includes a metal-organic mixed layer (MOML) comprising a mixture of a metal material and an organic material. The intermediate electrodes may further include a charge injecting material as part of the metal-organic mixed layer, or a charge injecting material may be a separate layer disposed between a metal-organic mixed layer and a luminescent region to provide the desired or required charge injecting function to the stacked OLED.

To avoid confusion in understanding the scope of a stacked OLED in accordance with the present disclosure, the following guidelines can be used:

(1) The term "layer" indicates a single coating generally having a composition that differs from the composition of an adjacent layer;

(2) The term "region" refers to a single layer, a plurality of layers such as two, three or more layers, and/or one or more "zones";

(3) The term "zone," as used in the context of the charge transport zone (i.e., hole transport zone and electron transport zone) and the light emitting zone, refers to a single layer, a plurality of layers, a single functional area in a layer, or a plurality of functional areas in a layer;

(4) Generally, all regions and layers of a display device that are between the two electrodes or that participate in the charge conduction processes needed to operate a display device are considered part of either a cathode, a luminescent region, an anode or an intermediate electrode;

(5) Generally, a layer (e.g., substrate) that does not participate in the charge conduction processes of a display device and that can be viewed as being outside of the first and second electrodes shall not be considered part of the electrodes; such a layer (e.g., substrate), however, still may be considered a part of the display device;

(6) A capping region (which protect an electrode from the ambient environment), however, is considered part of an electrode regardless whether the capping region participates in the charge conduction processes of the display device;

(7) Any region or layer (e.g., electron injection region and hole injection region) that injects charge into a luminescent region is considered part of an electrode;

(8) If an MOML can be equally viewed as part of an electrode or a luminescent region, the convention is that the MOML is part of an electrode;

(9) In embodiments containing a plurality of adjacent (i.e., contacting) MOMLs, if some or all of the MOMLs can be equally viewed as part of an electrode or a luminescent region, the convention is that the MOMLs are considered part of an electrode;

(10) Impurities (which may be present in small amounts in the two, three, four, or more material components making up the MOML) are generally not considered a designated component of the MOML; for example, the presence of impurities in a "Binary MOML" composed of the two designated components of the metal material and the organic compound would not change the designation of the MOML as being a "Binary MOML"; and (11) "Light emitting region" and "luminescent region" are used interchangeably.

Figure 1:
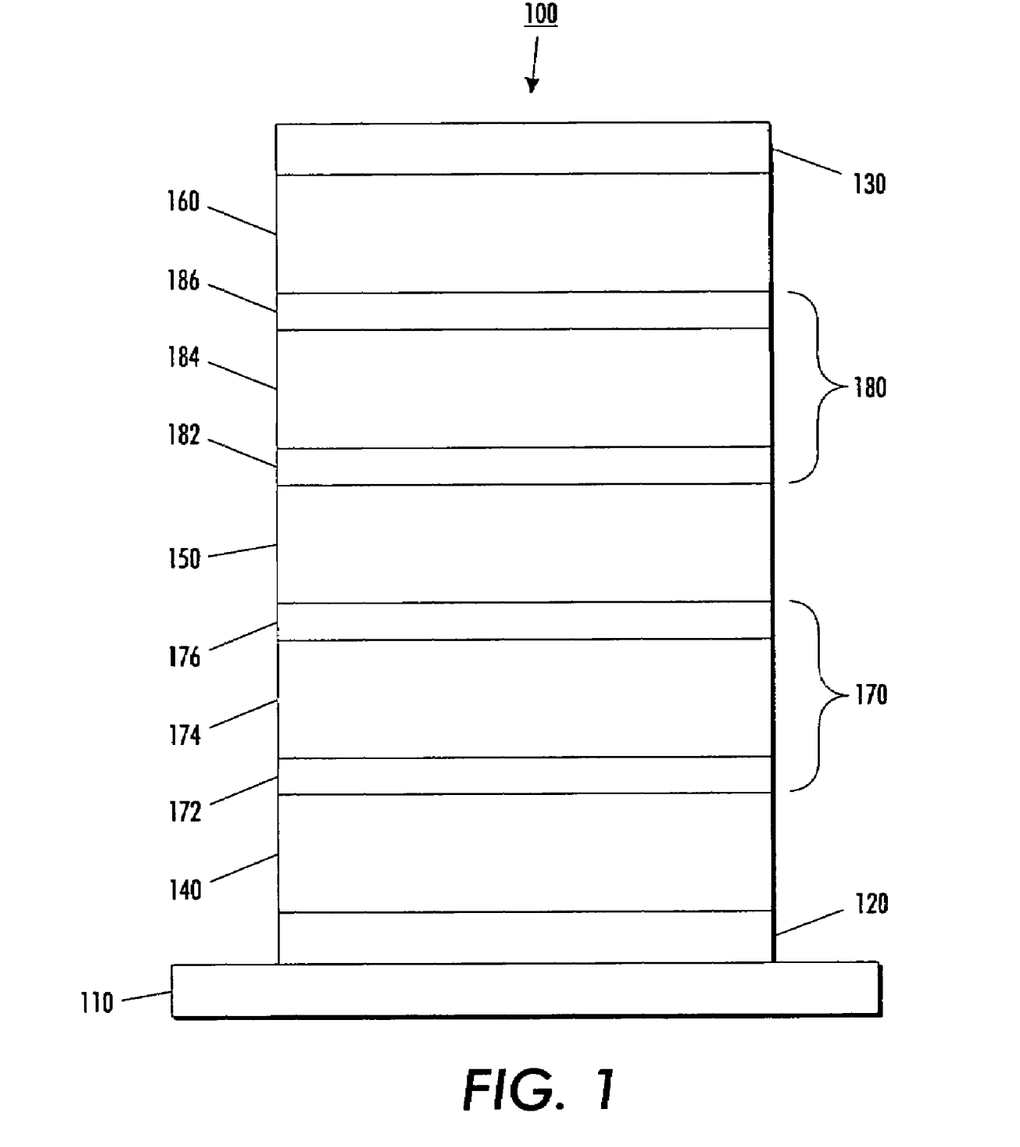
FIG. 1 is a schematic cross sectional view of an embodiment of a stacked OLED in accordance with the present disclosure.

With reference to FIG. 1, an embodiment of a stacked OLED in accordance with the present disclosure is shown. OLED 100 includes substrate 110, first electrode 120, second electrode 130, luminescent regions 140, 150, and 160 disposed between first electrode 120 and second electrode 130, intermediate electrode 170 disposed between luminescent regions 140 and 150, and intermediate electrode 180 disposed between luminescent regions 150 and 160. The first and second electrodes can be selected from one of an anode and a cathode. In embodiments, the first and second electrode are each an anode. In other embodiments, the first and second electrodes are each a cathode. In still other embodiments, the first electrode is an anode and the second electrode is a cathode, or the first electrode is a cathode and the second electrode is an anode.

At least one of the intermediate electrodes 170 or 180 includes a metal-organic mixed layer. In the stacked OLED 100 of FIG. 1, each of intermediate electrodes 170 and 180 include a metal-organic mixed layer 174 and 184, respectively. Metal-organic mixed layers 174 is disposed between charge injecting layers 172 and 176 and metal-organic mixed layer 184 is disposed between charge injecting layers 182 and 186, in respective intermediate electrodes 170 and 180.

The charge injecting layers (e.g., 172, 176, 182, and 186 of the embodiment in FIG. 1) may be an electron injecting layer or a hole injecting layer depending on the required function of the charge injecting layer in relation to the charge transport function of the immediately adjacent layer of a luminescent region. In embodiments, a luminescent region may comprise individual hole transport or electron transport layers or zones such as, for example, the OLEDs, disclosed in U.S. Pat. Nos. 4,539,507; 4,720,432; and 4,769,292, or in co-pending application Ser. No. 11/133,975 (published as US 2006/0261731). Therefore the composition of the charge injecting layers of an intermediate electrodes are selected as desired to provide the required function in a stacked OLED. For example, an intermediate electrode may be required to function as an electron injecting layer on one side and as a hole injecting layer on another side. In another embodiment, an intermediate electrode may be required to act as an electron injecting layer on both sides or as a hole injecting layer on both sides. For example, if the immediately adjacent layer of the luminescent region has a hole transporting functionality, then the selected charge injecting layer of the intermediate electrode is a hole injecting layer and includes a hole injecting material. Alternatively, if the immediately adjacent luminescent region functions as an electron transport zone, then the selected charge injecting layer of the intermediate electrode is an electron injecting layer and includes an electron injecting material.

Figure 2:
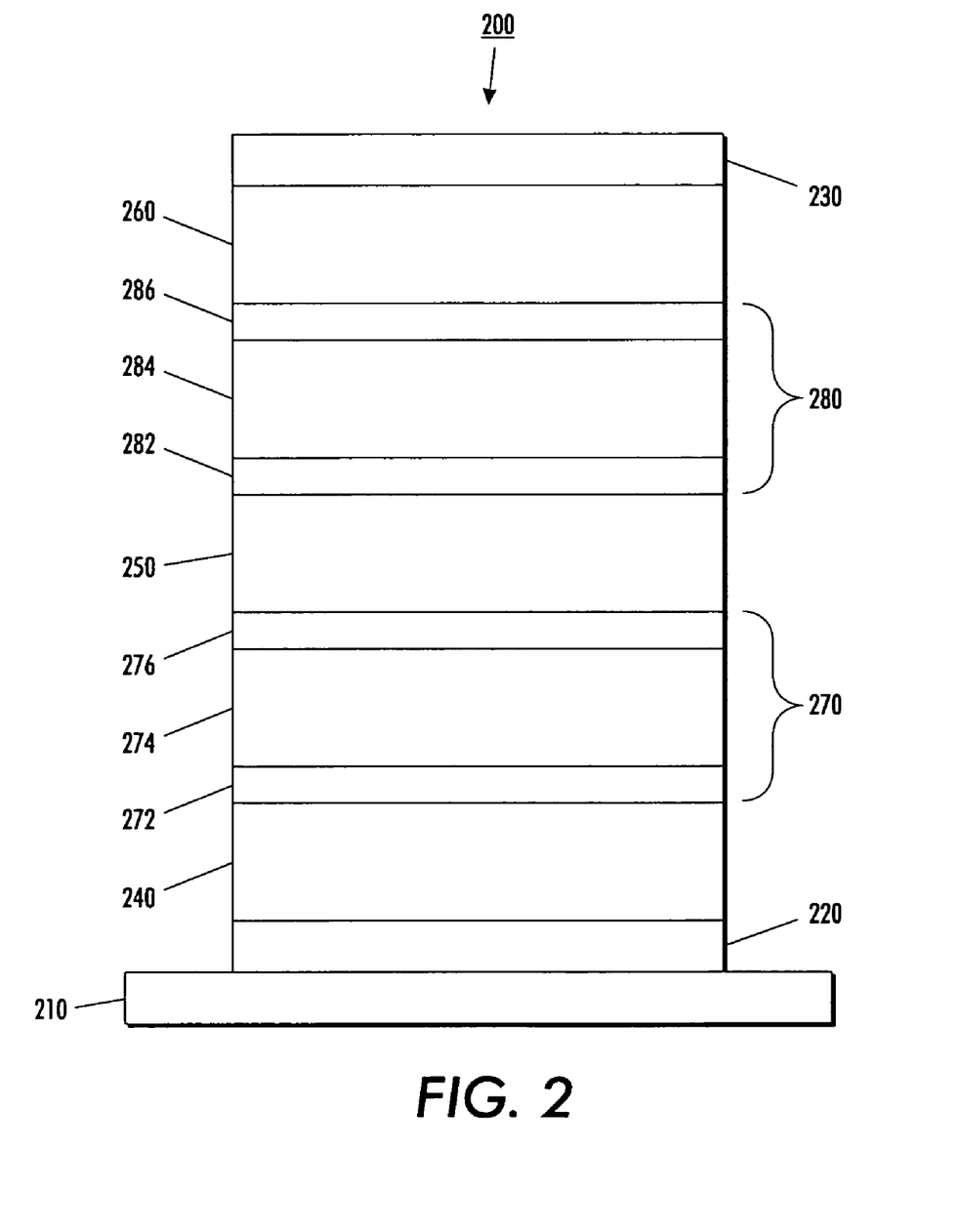
FIG. 2 is a cross sectional schematic view of another embodiment of a stacked OLED in accordance with the present disclosure.
Figure 3:
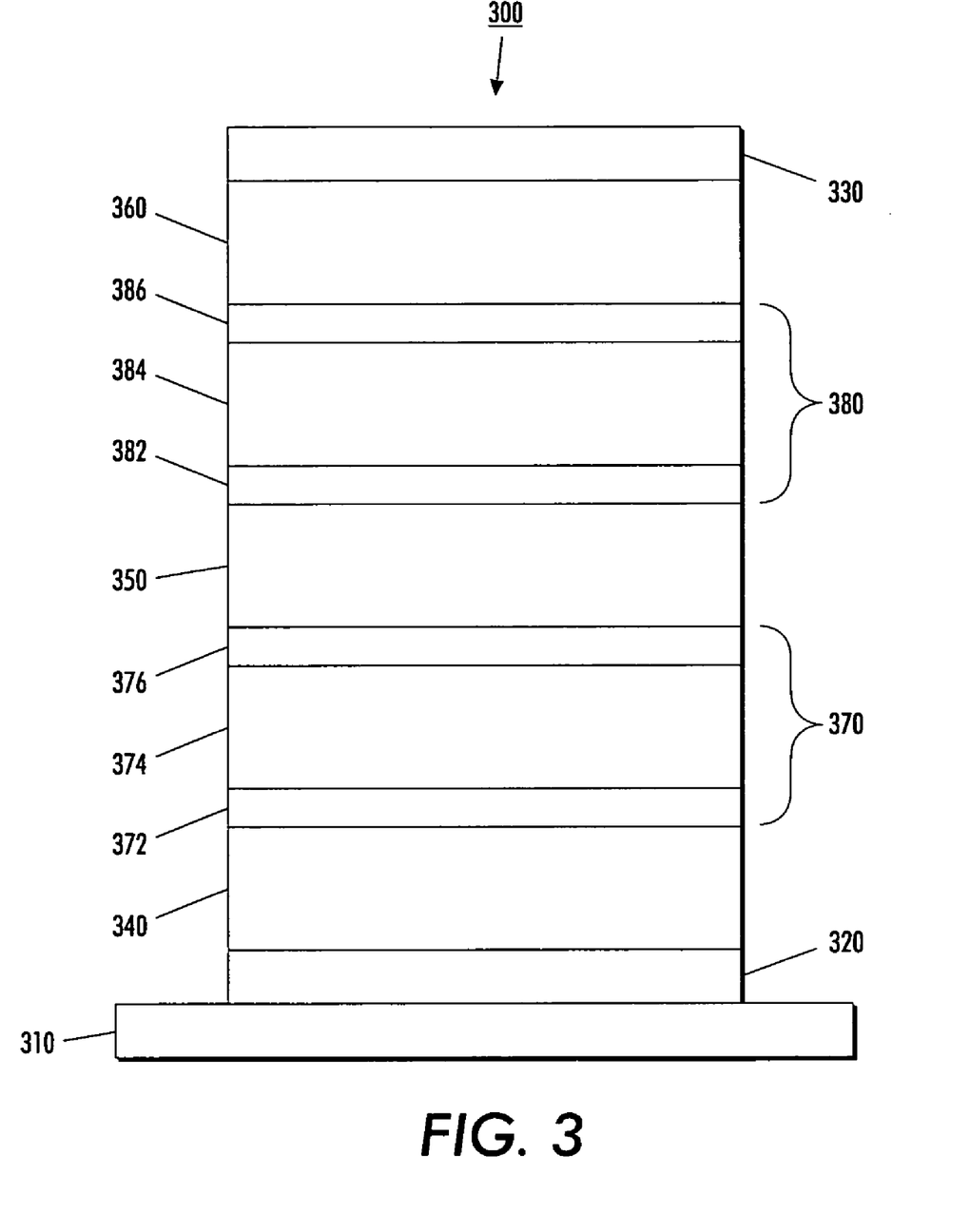
FIG. 3 is a further embodiment of a stacked OLED in accordance with the present disclosure.

With reference to FIGS. 2 and 3, stacked OLEDs are shown wherein the charge injecting layers of a given intermediate electrode have the same or similar charge injecting function. That is, the intermediate electrode has the same charge injecting function on both sides of the electrode. With reference to FIG. 2, stacked OLED 200 comprises substrate 210, anode 220, luminescent region 240, intermediate electrode 270 disposed on luminescent region 240, luminescent region 250 disposed on intermediate electrode 270, intermediate electrode 280 disposed on luminescent region 250, luminescent region 260 disposed on intermediate electrode 280, and cathode 230 disposed on luminescent region 260. Intermediate electrode 270 includes a metal-organic mixed layer 274 disposed between electron injecting layers 272 and 276. Intermediate electrode 280 includes metal-organic mixed layer 284 disposed between hole injecting layers 282 and 286. Uppermost electrode 230 may be one of a cathode or an anode depending on whether a hole injecting or electron injecting function is required based on the composition or configuration of luminescent region 260.

With reference to FIG. 3, stacked OLED 300 comprises substrate 310, cathode 320, an anode 330, luminescent regions 340, 350, and 360 disposed between the cathode 320 and the uppermost electrode 330, intermediate electrode 370 disposed between luminescent regions 340 and 350, and intermediate electrode 380 disposed between luminescent regions 350 and 360. Intermediate electrode 370 includes metal-organic mixed layer 374 disposed between hole injecting layers 372 and 376. Intermediate electrode 380 includes metal-organic mixed layer 384 disposed between electron injecting layers 382 and 386. Uppermost electrode 330 may be one of a cathode or an anode depending on the composition and/or configuration of luminescent region 360.

In an intermediate electrode having charge injecting layers of the same or similar charge injecting function, the charge injecting layers may be of the same or different compositions.

Figure 4:
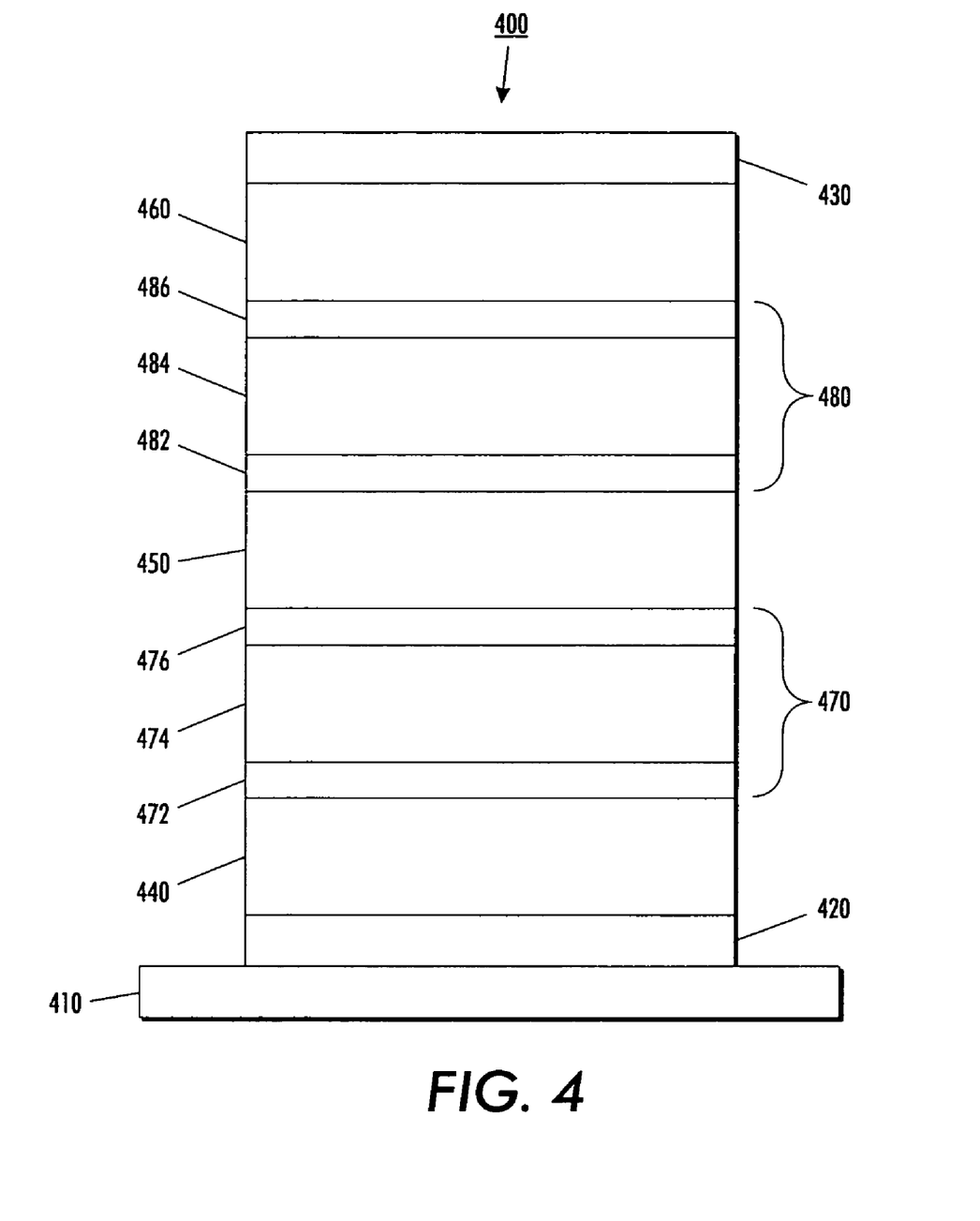
FIG. 4 is a cross sectional schematic view of still another embodiment of a stacked OLED in accordance with the present disclosure.
Figure 5:
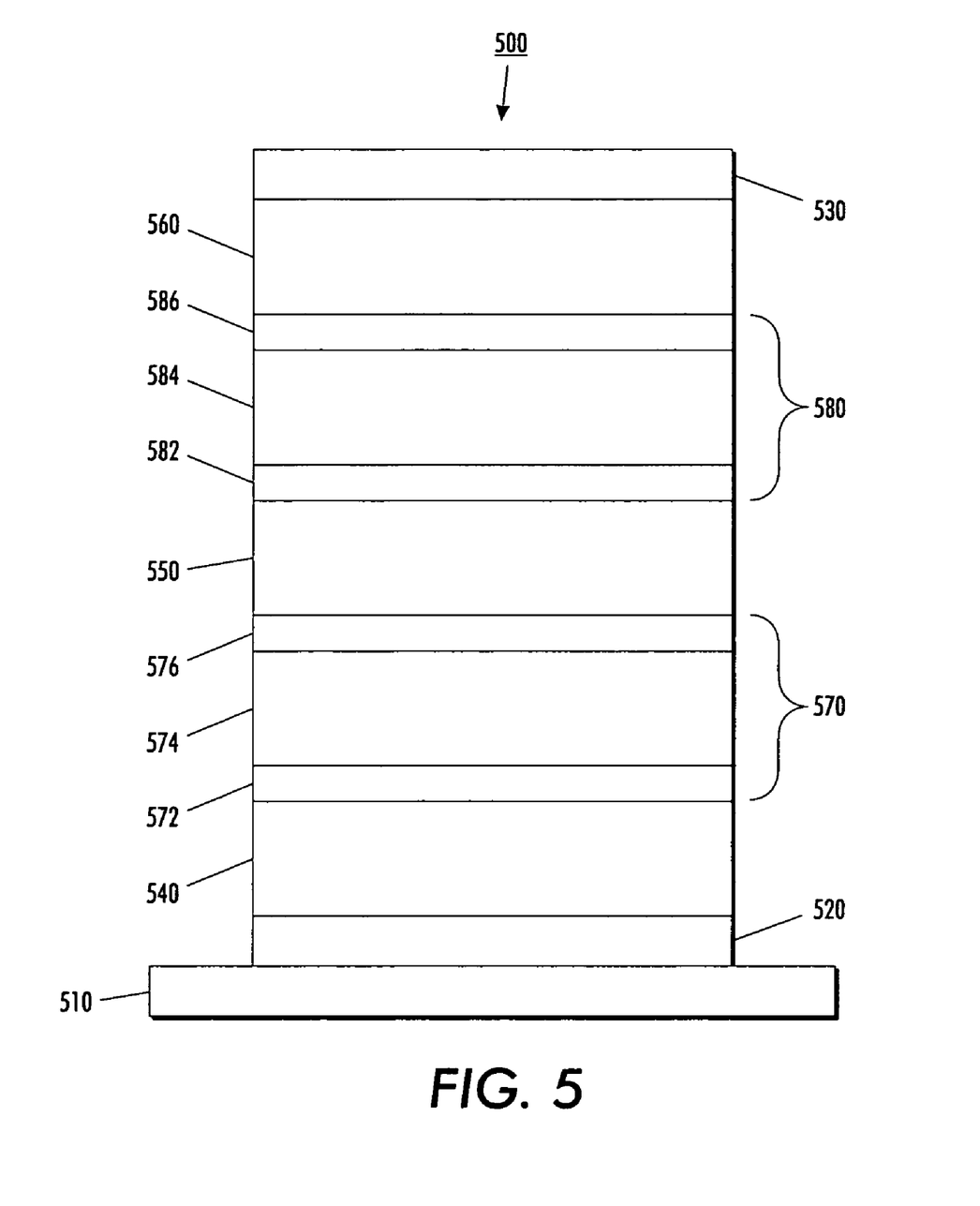
FIG. 5 is a cross sectional schematic view of still a further embodiment of a stacked OLED in accordance with present disclosure.

With reference to FIGS. 4 and 5, stacked OLEDs are shown wherein an intermediate electrode comprises charge injection layers having dissimilar functions, i.e., the intermediate electrode has a charge injection layer on one side having an electron injecting function and a charge injection layer on the other side having a hole injection function. With reference to FIG. 4, stacked OLED 400 comprises substrate 410, anode 420, cathode 430, luminescent region 440 disposed on anode 420, intermediate electrode 470 disposed on luminescent region 440, luminescent region 450 disposed on intermediate electrode 470, intermediate electrode 480 disposed on luminescent region 450, and luminescent region 460 disposed on intermediate electrode 480 and between cathode 430 and intermediate electrode 480. Intermediate electrode 470 includes metal-organic mixed layer 474 disposed between electron injecting layer 472 and hole injecting layer 476. Intermediate electrode 480 includes metal-organic mixed layer 484 disposed between electron injecting layer 482 and hole injecting layer 486.

With reference to FIG. 5, stacked OLED 500 comprises substrate 510, cathode 520, anode 530, luminescent regions 540, 550, and 560 disposed between cathode 520 and anode 530, intermediate electrode 570 disposed between luminescent regions 540 and 550, and intermediate electrode 580 disposed between luminescent regions 550 and 560. Intermediate electrode 570 includes metal-organic mixed layer 574 disposed between hole injecting layer 572 and electron injecting layer 576. Intermediate electrode 580 includes metal-organic mixed layer 584 disposed between hole injecting layer 582 and electron injecting layer 586.

In embodiments, when each of the intermediate electrodes comprises charge injection layers of dissimilar functions (i.e. when the metal-organic mixed layer is interposed between a hole injection layer and an electron injection layer), such as, for example, in the embodiments in FIGS. 4 and 5, then the stacked OLED can be operated by applying an external forward-bias voltage across the entire stack by means of applying the external forward-bias voltage only across the first and second electrodes, e.g., intermediate electrodes 470 and 480 in FIG. 4 and intermediate electrodes 570 and 580 in FIG. 5. Alternatively the stacked OLED can be operated by applying an external forward-bias voltage across each individual unit of the stack separately by means of applying external forward-bias voltage across for example, the first electrode and the first intermediate electrode (e.g., anode 420 and intermediate electrode 470 (FIG. 4), or cathode 520 and intermediate electrode 570 (FIG. 5)), the first intermediate electrode and the second intermediate electrode (e.g., intermediate electrodes 470 and 480 (FIG. 4), or intermediate electrodes 570 and 580 (FIG. 5)), and the second intermediate electrode and the second electrode (e.g., intermediate electrode 480 and cathode 430 (FIG. 4), or intermediate electrode 580 and anode 530 (FIG. 5)).

In embodiments, when each of the intermediate electrodes individually comprises charge injection layers having the same or similar function (i.e. when the metal-organic mixed layer is interposed between two hole injection layers or between two electron injection layers), then the stacked OLED can be operated by applying an external forward-bias voltage across each of the individual units of the stack separately by means of applying external forward-bias voltage across for example, the first anode and the first intermediate electrode (e.g., anode 220 and intermediate electrode 270 (FIG. 2), or cathode 320 and intermediate electrode 370 (FIG. 3)), the first intermediate electrode and the second intermediate electrode (e.g., intermediate electrodes 270 and 280 (FIG. 2), or intermediate electrodes 370 and 380 (FIG. 3)), and the second intermediate electrode and the second electrode (e.g., intermediate electrode 280 and cathode 230 (FIG. 2), or intermediate electrode 380 and anode 330 (FIG. 3))

It will be appreciated that the embodiments depicted in FIGS. 1-5 are merely illustrative examples of possible embodiments of a stacked OLED in accordance with the present disclosure and not limiting embodiments thereof. The configuration of any layer, region, or zone may be selected as desired for a particular purpose or intended use. While the embodiments depict a stacked OLED with 3 luminescent regions, it will be appreciated that a stacked OLED may include 2, 3, 4, 5 or more luminescent regions. Thus, for example, in FIG. 1, 2, or 3, the respective stacked OLEDs could eliminate luminescent regions 160, 260, or 360, or additional luminescent regions and intermediate electrodes could be further disposed between luminescent regions 160, 260, and 360 and upper electrodes 130, 230, and 330, respectively.

In embodiments, an intermediate electrode comprises a metal-organic mixed layer disposed between a first charge injecting layer and a second charge injecting layer, the first charge injecting layer being a hole injecting layer and the second charge injecting layer being an electron injecting layer. In still other embodiments, an intermediate electrode may comprise a metal-organic mixed layer disposed between a first charge injecting layer and a second charge injecting layer, wherein each of the first and second charge injecting layers has the same charge injecting function (i.e., hole injecting or electron injecting).

In a stacked OLED comprising more than one intermediate electrode at least one of the intermediate electrodes comprises a MOML. The other intermediate electrodes can be any other suitable electrode material that provides the required function. Other materials suitable as an intermediate electrode include, but are not limited to, those described herein with reference to the anode and cathode materials, and the intermediate electrodes described in co-pending application Ser. No. 11/133,975 (published as US 2006/0261731), which is incorporated herein by reference in its entirety.

An anode can comprise suitable positive charge injecting electrodes such as indium tin oxide (ITO), tin oxide, gold and platinum. Other suitable materials for forming the anode include, but are not limited to, electrically conductive carbon, π-conjugated polymers such as polyaniline, polythiophene, polypyrrole, and the like having, for example, a work function equal to, or greater than, about 4 eV, and in embodiments, from about 4 eV to about 6 eV.

An anode can have any suitable form. A thin conductive layer can be coated onto a light transmissive substrate, such as, for example, a transparent or substantially transparent glass plate or plastic film. Embodiments of organic light emitting devices can comprise a light transmissive anode formed from tin oxide or indium tin oxide coated on glass. Also, very thin light-transparent metallic anodes having a thickness, for example, of less than about 200 Å, and, in embodiments, from about 50 Å to about 175 Å, and in other embodiment from about 75 Å to about 150 Å can be used. These thin anodes can comprise metals such as gold, palladium and the like. In addition, transparent or semi-transparent thin layers of conductive carbon or conjugated polymers such as polyaniline, polythiophene, polypyrrole and the like can be used to form anodes. Additional suitable forms of the anode are disclosed in U.S. Pat. No. 4,885,211, which is incorporated herein by reference in its entirety.

The thickness of an anode can range from about 1 nm to about 5000 nm. The preferred thickness range of an anode is dependent on the optical constants of the anode material. In one embodiment, the thickness range of the anode is from about 30 nm to about 300 nm. Thicknesses outside of this range, however, can also be used.

A luminescent region of the present display devices comprises in embodiments at least one electroluminescent organic material. Suitable organic electroluminescent materials include, for example, polyphenylenevinylenes, such as poly(p-phenylenevinylene) PPV, poly(2-methoxy-5-(2-ethylhexyloxy) 1,4-phenylenevinylene) MEHPPV and poly(2,5-dialkoxyphenylenevinylene) PDMeOPV, and other materials disclosed in U.S. Pat. No. 5,247,190, which is incorporated herein by reference in its entirety; polyphenylenes, such as poly(p-phenylene) PPP, ladder-poly-paraphenylene (LPPP), and poly(tetrahydropyrene) PTHP; and polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers (see e.g., Bernius et al., "Developmental Progress of Electroluminescent Polymeric Materials and Devices," Proceedings of SPIE Conference on Organic Light Emitting Materials and Devices III, Denver, Colo., July 1999, Volume 3797, p. 129, the entire disclosure of which is incorporated herein by reference).

Another class of organic electroluminescent materials that can be utilized in a luminescent region includes, but is not limited to, the metal oxinoid compounds as disclosed in U.S. Pat. Nos. 4,539,507; 5,151,629; 5,150,006; 5,141,671 and 5,846,666, each incorporated herein by reference in its entirety. Illustrative examples include tris(8-hydroxyquinolinate) aluminum (AlQ3), and bis(8-hydroxyquinolato)-(4-phenylphenolato) aluminum (BAlq). Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds disclosed in U.S. Pat. No. 5,846,666 (which is incorporated herein by reference in its entirety), such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato)cadmium, tris(8-quinolinethiolato)gallium, tris(8-quinolinethiolato)indium and bis[benzo{f}-8-quinolinethiolato]zinc.

Still another class of organic electroluminescent materials that can be used in the luminescent region comprises stilbene derivatives, such as those disclosed in U.S. Pat. No. 5,516,577, incorporated herein by reference in it entirety. An example of a suitable stilbene derivative is 4,4'-bis(2,2-diphenylvinyl)biphenyl.

A further class of organic electroluminescent materials that can be used in the luminescent region comprises anthracenes, such as, for example 2-t-butyl-9,10-di-(2-naphthyl) anthracene, 9,10-di-(2-naphthyl) anthracene, 9,10-di-phenyl anthracene, 9,9-bis[4-(9-anthryl)phenyl] fluorine, and 9,9-bis[4-(10-phenyl-9-anthryl)phenyl] fluorine. Other suitable anthracenes are disclosed in U.S. Pat. No. 6,465,115 (corresponding to EP 1009044 A2); U.S. Pat. Nos. 5,972,247; 5,935,721; and 6,479,172, the entire disclosures of which are incorporated herein by reference.

Another class of suitable organic electroluminescent materials suitable for utilizing in a luminescent region is the oxadiazole metal chelates disclosed in U.S. application Ser. No. 08/829,398, now U.S. Pat. No. 5,925,472, which is incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato] zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato] zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium, and the like; and the triazines including those disclosed in U.S. application Ser. No. 09/489,144, filed on Jan. 21, 2000 and U.S. Pat. No. 6,057,048, each incorporated herein in its entirety.

A luminescent region can further include from about 0.01 weight percent to about 25 weight percent of a luminescent material as a dopant. Examples of dopant materials that can be utilized in a luminescent region are fluorescent materials, such as, for example, coumarin, dicyanomethylene pyranes, polymethine, oxabenzanthrane, xanthene, pyrylium, carbostyl, perylene, and the like. Another preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like as disclosed in U.S. Pat. Nos. 5,227,252; 5,276,381 and 5,593,788, each incorporated herein in its entirety. Another class of fluorescent materials that may be used is fused ring fluorescent dyes. Exemplary suitable fused ring fluorescent dyes include perylene, rubrene, anthracene, coronene, phenanthrecene, pyrene and the like, as disclosed in U.S. Pat. No. 3,172,862, which is incorporated herein by reference in its entirety. Also, fluorescent materials include butadienes, such as 1,4-diphenylbutadiene and tetraphenylbutadiene, and stilbenes, and the like, as disclosed in U.S. Pat. Nos. 4,356,429 and 5,516,577, each incorporated herein by reference in its entirety. Other examples of fluorescent materials that can be used are those disclosed in U.S. Pat. No. 5,601,903, which is incorporated herein by reference in its entirety.

Additionally, luminescent dopants that can be utilized in a light luminescent region are the fluorescent dyes disclosed in U.S. Pat. No. 5,935,720 (which is incorporated herein by reference in its entirety), such as, for example, 4-(dicyanomethylene)-2-I-propyl-6-(1,1,7,7-tetramethyljulolidyl-9-enyl)-4H-pyran (DCJTB); the lanthanide metal chelate complexes, such as for example, tris(acetylacetonato) (phenanthroline) terbium, tris(acetylacetonato) (phenanthroline) europium, and tris(thenoyl trisfluoroacetonato)(phenanthroline) europium, and those disclosed in Kido et al., "White light emitting organic electroluminescent device using lanthanide complexes," Jpn. J. Appl. Phys., Volume 35, pp. L394-L396 (1996), which is incorporated herein by reference in its entirety; and phosphorescent materials, such as, for example, organometallic compounds containing heavy metal atoms that lead to strong spin-orbit coupling, such as those disclosed in Baldo et al., "Highly efficient organic phosphorescent emission from organic electroluminescent devices," Letters to Nature, Volume 395, pp. 151-154 (1998), which is incorporated herein by reference in its entirety. Suitable examples include 2,3,7,8,12,13,17,18-octaethyl-21H23H-phorpine platinum(II) (PtOEP) and fac-tris(2-phenylpyridine)iridium (Ir(ppy)3).

A luminescent region can also include one or more materials with hole transporting properties. Examples of hole transporting materials that can be utilized in the luminescent region include polypyrrole, polyaniline, poly(phenylene vinylene), polythiophene, polyarylamine as disclosed in U.S. Pat. No. 5,728,801, which is incorporated herein by reference in its entirety, and their derivatives, and known semiconductive organic materials; porphyrin derivatives such as 1,10,15,20-tetraphenyl-21H,23H-porphyrin copper (II) disclosed in U.S. Pat. No. 4,356,429, incorporated herein by reference in its entirety; copper phthalocyanine, copper tetramethyl phthalocyanine; zinc phthalocyanine; titanium oxide phthalocyanine; magnesium phthalocyanine; and the like.

A specific class of hole transporting materials that can be utilized in a luminescent region are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl)phenylmethane, N,N,N-tri(p-tolyl)amine,1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, N,N'-di(naphthalene-1-yl)-N,N'-diphenyl-benzidine ("NPB"), mixtures thereof and the like. Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)$_4$-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)$_4$-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

Another class of the hole transporting materials that can be used in a luminescent region are the indolo-carabazoles, such as those disclosed in U.S. Pat. Nos. 5,942,340 and 5,952,115, each incorporated herein by reference in its entirety, such as, for example, 5,11-di-naphthyl-5,11-dihydroindolo[3,2-b]carbazole, and 2,8-dimethyl-5,11-di-naphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N-di-1-naphthyl-N,N'-diphenyl-1,1'-biphenyl-4,4'-diamine; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. In one embodiment, the hole transporting materials that can be used in a luminescent region are the naphtyl-substituted benzidine derivatives.

A luminescent region can also include one or more materials with electron transporting properties. An example of electron transporting materials that can be utilized in the luminescent region includes polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers, as disclosed in incorporated Bernius et al., Proceedings of SPIE Conference on Organic Light Emitting Materials and Devices III, Denver, Colo., July 1999, Volume 3797, p. 129.

Other examples of electron transporting materials that can be utilized in a luminescent region can be selected from the metal oxinoid compounds, the oxadiazole metal chelate compounds, the triazine compounds and the stilbene compounds, examples of which have been described above in detail.

In embodiments where a luminescent region includes one or more hole transport material and/or one or more electron transport material in addition to the organic electroluminescent material(s), the organic electroluminescent material, the hole transport material(s), and/or the electron transport material(s) can be formed in separate layers, such as, for example, the OLEDs disclosed in U.S. Pat. Nos. 4,539,507; 4,720,432 and 4,769,292; or in the same layer thus forming mixed zones, of two or more materials, such as, for example, the OLEDs disclosed in U.S. Pat. Nos. 6,130,001; 6,392,250; 6,392,339; 6,614,175; 6,753,098; and 6,759,146. The disclosures of these patents are incorporated herein by reference in their entirety. The use of mixed regions in a luminescent region of a stacked OLED are described in co-pending application Ser. No. 11/133,975 (published as US 2006/0261731), the entire disclosure of which is incorporated herein by reference.

The luminescent region for any display device in accordance with the present disclosure can include any suitable material such as those materials disclosed herein. For example, the luminescent region can include any one or a mixture of two or more of the following: molecular (small-molecule) electroluminescent materials, polymer electroluminescent materials, and inorganic electroluminescent materials. Examples of molecular (small-molecule) electroluminescent materials and polymer electroluminescent materials are disclosed herein. Inorganic electroluminescent materials include, for instance, phosphors, such as, ZnS, ZnSe, ZnTe, CdS, CdSe, CdTe, and the like, and which can further include dopants, such as, Cu, Mn and the lanthanides. Other examples of inorganic electroluminescent materials include GaAs, GaP, GaAsP, GaAlAs, InGa, SiC, GaN, AlInGaP, InGaN, InSe, and the like, and which can further include dopants, such as, Zn, O, N, Si and the like.

The thickness of a luminescent region can vary from for example, about 1 nm to about 1000 nm. In embodiments, a luminescent region has a thickness of from about 20 nm to about 200 nm. In other embodiments, a luminescent region has a thickness of from about 50 nm to about 150 nm. The thickness of the individual luminescent regions of a stacked OLED may be selected as desired for an intended purpose. In embodiments, the luminescent regions may have the same or different thicknesses.

The cathode can comprise any suitable metal, including high work function components having a work function, for example, from about 4 eV to about 6 eV, or low work function components such as metals with, for example, a work function of from about 2.5 eV to about 4.eV. The cathode can comprise a combination of a low work function (less than about 4 eV) metal and at least one other metal. Effective proportions of the low work function metal to the second or other metal are from less than about 0.1 weight percent to about 99.9 weight percent, and more specifically, from about 3 to about 45 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. The Mg—Ag alloy cathodes of U.S. Pat. No. 4,885,211, the disclosure of which is totally incorporated herein by reference, disclose one suitable cathode construction. Another cathode construction is described in U.S. Pat. No. 5,429,884, the disclosure of which is totally incorporated herein by reference, wherein the cathodes are formed from lithium alloys with other high work function metals such as aluminum and indium. Another suitable material for a cathode is aluminum metal.

A cathode can comprise at least one transparent conducting material, such as for example, indium-tin-oxide (ITO), and other materials, such as, for example, those disclosed in U.S. Pat. Nos. 5,703,436 and 5,707,745, the disclosures of which are totally incorporated herein by reference.

A cathode may also comprise a metal-organic mixed layer and have a configuration as described in U.S. Pat. No. 6,841,932 and U.S. patent application Ser. No. 10/401,238, now U.S. Pat. No. 7,288,887, the entire disclosures of which are incorporated herein by reference.

The thickness of a cathode can range from, for example, about 10 nanometers to about 500 nanometers, and more specifically, from about 25 to about 300 nanometers, although thicknesses outside of these ranges may be used. A cathode can be formed using any suitable thin film forming method. Exemplary methods for forming the cathode include vapor deposition in vacuum, electron-beam deposition and sputtering deposition.

At least one intermediate electrode of a stacked OLED or display device in accordance with the present disclosure comprises a MOML disposed between two charge injecting layers. The configuration of an intermediate electrode comprising a MOML may be selected as desired for an intended purpose or use. In one embodiment, an MOML is disposed between a hole injecting layer and an electron injecting layer. In another embodiment, an MOML is disposed between two hole injecting layers. In still another embodiment, an MOML is disposed between two electron injecting layers. The intermediate electrode may also include a plurality of MOMLs. In embodiments wherein a stacked OLED comprises a plurality of intermediate electrodes and at least two intermediate electrodes comprise a MOML, the configuration and makeup of the MOMLs and/or charge injecting layers may be the same or different.

A MOML comprises a metal material and an organic material. Metal-organic mixed layers suitable for use in an intermediate electrode include those disclosed in U.S. Pat. No. 6,841,932 and application Ser. No. 10/401,238 (published as Pat. Application No. 2003/0234609), the entire disclosures of which are incorporated herein by reference.

Metal containing materials for a MOML include for example metals and inorganic metal compounds. As used herein, the phrase "metal of the metal containing material" (where such phrase precedes a list of specific elemental metals) refers to both elemental metals and the metal component of inorganic metal compounds. The metals can be, but are not limited to, for example, Li, Na, K, Rb, Cs, Be, Mg, Ca, Sr, Ba, Sc, Y, La, Ti, Zr, Hf, V, Nb, Ta, Cr, Mo, W, Mn, Tc, Fe, Ru, Os, Co, Rh, Ir, Ni, Pd, Pt, Cu, Ag, Au, Zn, Cd, B, Al, Ga, In, Sn, Pb, Sb, Bi, Se, Te, Ce, Nd, Sm, and Eu. In embodiments, the term "metals" includes Sb, Se, and Te. In embodiments, a metal alloy can be used to form the MOML. One metal of the metal alloy is considered the metal containing material; the other metal or metals of the metal alloy are considered the additional component or components of a MOML. For instance, a binary metal alloy in combination with the organic material would be considered a Ternary MOML.

An inorganic metal compound for a MOML may be a metal halide (e.g., fluoride, chloride, bromide, iodide), metal oxide, metal hydroxide, metal nitride, metal sulfide, metal carbide, and a metal boride). Suitable metal halides can be, but are not limited to, for example, LiF, LiCl, LiBr, LiI, NaF, NaCl, NaBr, NaI, KF, KCl, KBr, KI, RbF, RbCl, CsF, CsCl, $MgF_2$, $CaF_2$, $SrF_2$, $AlF_3$, AgCl, AgF, and $CuCl_2$. Suitable metal oxides can be, but are not limited to, $Li_2O$, $Ca_2O$, $Cs_2O$, $In_2O_3$, $SnO_2$, ZnO, ITO, $Cu_2O$, CuO, $Ag_2O$, NiO, TiO, $Y_2O_3$, $ZrO_2$, $Cr_2O_3$. A suitable metal hydroxide can be, but is not limited to, for example, AgOH. A suitable metal nitride can be, but is not limited to, LaN, YN and GaN. Suitable metal sulfide include, but are not limited to, ZnS, $Sb_2S_3$, $Sb_2S_5$, and CdS. Suitable metal carbides can be, but are not limited to, $Li_2C$, FeC and NiC. A metal boride can be, but is not limited to, $CaB_6$.

Inorganic materials for a MOML include for example: (i) elemental non-metal materials such as C, Si, and Ge; (ii)

inorganic compounds of these elemental non-metal materials such as SiC, SiO, $SiO_2$, $Si_3N_4$; and (iii) inorganic metal compounds such as those described herein. Since there is a separate component category for metals (in the list of components for a MOML), metals are not classified as inorganic materials.

As described herein, some metal compounds are known to be electrically conductive and light absorbing. Mixtures of organic compounds and these metal compounds therefore in embodiments may be able to realize the desired features of a present OLED. In embodiments, the metal containing material for use in a MOML may be a metal compound, particularly metal compounds that may be both electrically conductive and light absorbing such as, for example, $Ag_2O$, $Cu_2O$, CuO, FeO, $Fe_2O_3$, $Fe_3O_4$, NiO, $V_2O_5$, ZnS, ZnO, $In_2O_3$ and $SnO_2$.

Suitable organic materials for a MOML can be for example electroluminescent materials utilized in fabricating the luminescent region of the display device, such electroluminescent materials being described herein. For example, suitable organic materials for a MOML can include molecular (small-molecule) organic compounds such as metal oxinoids, metal chelates, tertiary aromatic amines, indolocarbazoles, porphyrins, phthalocyanines, triazines, anthracenes, and oxadiazoles; and polymeric compounds such as polythiophenes, polyfluorenes, polyphenylenes, polyanilenes, and polyphenylenevinylens. Other organic compounds that can also be used in the MOML include polypolycarbonates, polyethylenes, polystyrenes, organic dyes and pigments (e.g., perinones, coumarines, and other fused aromatic ring compounds).

An MOML can be a "Binary MOML" (with two components), a "Ternary MOML" (with three components), "Quaternary MOML" (with four components), or other MOML with more than four components. Binary, ternary, and quaternary MOMLs are described in U.S. Pat. No. 6,841,932 and U.S. patent application Ser. No. 10/401,238, now U.S. Pat. No. 7,288,887, the entire disclosures of which are incorporated herein by reference. In these embodiments, the selection of the metal containing material, the organic compound and any other additional components is made on the basis that the MOML should have the desired property or properties. In addition to being light reflection-reducing, an MOML can optionally possess one or more additional desired properties including for example being electrically conductive and any other properties that the MOML may need to have in order to serve other functions as may be required by the location of the MOML in the display device (such as the need to also be capable of injecting charge efficiently if the MOML is the part of an electrode that is adjacent the luminescent region). In cases when a display device includes a plurality of MOMLs, the MOMLs can be of the same or different material composition (with respect to the components and their concentrations).

It is noted that the lists of suitable materials for the components in a particular MOML type may overlap. For example, in a "Ternary MOML," suitable materials for the second component (i.e., an organic material) are the same as the choice of "organic materials" for the third component. In addition, in a "Ternary MOML," suitable materials for the first component (i.e., an inorganic metal containing material) overlap with the choice of "metals" and "inorganic materials" for the third component. However, no inconsistency is present even if the lists of suitable materials for the components in a particular MOML type overlap as long as the selected components of the MOML type are different from one another, i.e., each selected component is unique.

Generally speaking, the MOML can be comprised of from about 5 vol. % to about 95 vol. % of the organic compound and from about 95 vol. % to about 5 vol. % of the metal containing material. In other embodiments, an MOML can comprise from about 5 vol. % to about 30 vol. % of the metal containing material and from about 70 vol. % to about 95 vol. % of the organic metal. More preferred ranges will depend on the particular materials selected.

A MOML, in embodiments, possesses a generally uniform composition across the entire MOML thickness. To achieve the generally uniform composition, a MOML can be prepared by using a "controlled mixing ratio method" (e.g., spin coating and co-deposition). Thus, in embodiments, a MOML is a mixture of controlled composition, in the sense that the mixing ratio of the different components is controlled to certain levels by means of controlling for instance the evaporation rate of each of the different components which are evaporated from separate evaporation sources simultaneously. In embodiments, the ratios of the different components in a MOML generally stay the same and do not change with time (i.e., ratios of the components in the MOML if measured immediately after fabrication will be equal to their ratios a few days later and longer).

In other embodiments, a MOML may have a non-uniform composition across the entire MOML thickness. Co-deposition can be used to produce the non-uniform composition of the MOML (e.g., by varying the co-deposition rates of the MOML materials during formation of the MOML). Due to intra-layer diffusion or inter-layer diffusion, there may occur in certain embodiments of a MOML a change from a generally uniform composition (when prepared by a "controlled mixing ratio method") to a non-uniform composition over long periods of time. In addition, inter-layer diffusion of materials can be used to prepare a MOML. Diffusion is a less preferred approach for fabricating the MOML for the following reasons: (a) diffusion may require significant time (days, weeks, months, or longer); (b) the mixing ratio changes with time; and (c) one has less control over the desired ratio of MOML materials.

In embodiments, adjacent MOMLs composed of the same components but in different concentrations are viewed to be distinct MOMLs rather than a single MOML with a non-uniform composition if the concentration of one of the components changes by at least 5% over a distance of no more than 5 nm in a direction parallel to the thickness of a MOMLs measured during or immediately after a MOMLs fabrication.

In embodiments, a MOML is generally substantially transparent as well as electrically conductive. An electrically conductive MOML can have a cross-sectional (i.e., across the MOML thickness) ohmic resistance not exceeding, for example, about 100,000 Ohms, and particularly, not exceeding about 5,000 Ohms. In embodiments, an MOML has a cross-sectional ohmic resistance not exceeding 1,000 Ohms. In other embodiments, however, the MOML may be considered electrically non-conductive, e.g., possessing an ohmic resistance value somewhere higher than the illustrative range described herein.

In general, the MOML can be substantially transparent. A substantially transparent MOML, in embodiments, can have a transmittance of, for example, at least 50% and typically a transmittance of at least 75% over at least a part of the visible light range (i.e. electromagnetic radiation in the range 400-700 nm).

Any suitable technique and apparatus can be used to form a MOMLs and the rest of the display device. For example, there may be employed thermal deposition (i.e., physical vapor deposition—"PVD"), spin-coating, sputtering, electron beam, electric arc, chemical vapor deposition ("CVD"), and the like. The first two techniques, and PVD in particular, may be the more desirable approaches. In the case of PVD, a MOML can be formed by means of for example co-evaporating the components of a MOML, with the deposition rate of each of the materials independently controlled to achieve the desired mixing ratio. These preferred mixing ratios may be determined on a trial and error basis for specific material combinations. The phrase "controlled mixing ratio method" refers to spin-coating and co-deposition. Co-deposition refers to thermal deposition (i.e., physical vapor deposition—"PVD"), sputtering, electron beam, electric arc, chemical vapor deposition ("CVD"), and the like.

An electron injecting layer of an intermediate electrode may comprise any suitable electron injecting material. Suitable electron injecting materials include those materials suitable for performing a cathode as described herein. Other suitable electron injecting materials include metals such as, but not limited to, Ca, Li, K, Na, Mg, Al, In, Y, Sr, Cs, Cr, Ba, Sc and compounds thereof. An electron injecting material may also be an inorganic material including, but not limited to, SiO, $SiO_2$, LiF, CsF, $MgF_2$, BaO, and mixtures thereof. In one embodiment, the electron injecting material is a mixture of Mg and Ag.

A hole injecting layer of an intermediate electrode comprises any suitable hole injecting material. In embodiments, a hole injecting layer may comprise a hole injecting material suitable as an anode as described herein.

In other embodiments, the hole injecting material comprises an electron-accepting material than can oxidize an organic compound in a luminescent region. Suitable electron-accepting organic materials include inorganic compounds such as those described in U.S. Pat. No. 6,423,429 to Kido, et al., the entire disclosure of which is incorporated herein by reference. Such inorganic compounds include Lewis acids such as $FeCl_3$, $AlCl_3$, $GaCl_3$, $InCl_3$, $SbCl_5$, and combinations thereof. Suitable electron-accepting organic materials include, but are not limited to trinitrofluorenone, and 2,3,5,6-tetrafluoro-7,7,8,8-tetracyanoquinodimethane ($F_4TCNQ$). Hole injecting layers comprising an electron-accepting material as described above may optionally comprise an organic material such as a hole transport material. Suitable hole transport materials include those previously described herein including but not limited to N,N'-di(naphthalene-1-yl)-N,N'-diphenylbenzidine (NPB), 4,4'4"-tris(N,N-diphenylamino) triphenylamine (mTDATA), 2,5-ditert-butylphenyl-N,N'-diphenyl-N,N'bis(3-methylphenyl-(1,1'-biphenyl)-4,4'-diamine (BP-TPD), N,N'-diphenyl-N,N'-bis(3) methylphenyl-(1,1'-biphenyl)-4,4'-diamine (TPD), copper phthalocyanine (CuPc), vanadyl-phthalocyanine (VOPc), poly(3,4-ethylenedioxythiophene) (PEDOT), polyaniline (PAni), and the like. Such hole injecting layers are amenable to vapor deposition techniques. Anode configurations comprising an electron-accepting material and optionally a hole transport material are described in co-pending application Ser. No. 11/133,977 (publication 2006/0263628), the entire disclosure of which is incorporated herein by reference. In embodiments, a hole injecting layer of an intermediate electrode comprises only an electron-accepting material or combination of electron-accepting materials. In other embodiments, a hole injecting layer of an intermediate electrode comprises an electron-accepting material or combination of electron-accepting materials and a hole transport material. In embodiments, the ratio of electron-accepting material to hole transport material in a hole injecting layer of an intermediate electrode is from about 10:90 to about 90:10 volume percent.

The thickness of an intermediate electrode may be selected as desired for a particular purpose or intended use. In embodiments, the total thickness of an intermediate electrode is from about 5 to about 250 nm. An intermediate electrode comprising a MOML disposed between first and second charge injecting layers has, in embodiments, a thickness of from about 10 to about 100. The thickness of the MOML may range, in embodiments, from about 5 to about 100 nm. Additionally, the thickness and/or metal concentration of the MOML may be selected to provide a desired level of transparency or conductivity. Generally, an MOML will be more transparent and more conductive as the thickness is decreased and/or the metal concentration is increased. The charge injecting layers may independently have a thickness of from about 0.1 to about 50 nm. In other embodiments, the charge injecting layers independently have a thickness of from about 1 to about 25 nm.

In embodiments, a MOML can be formed using the following illustrative PVD procedures: (i) co-evaporating the inorganic metal compound, the organic compound, and any optional additional components, (ii) co-evaporating an elemental metal, an organic compound, and any optional additional components, where the elemental metal is transformed into the inorganic metal compound of (i) during the process or in a MOML, or even by (iii) co-evaporating a different inorganic compound of the elemental metal of (ii), an organic compound, and any optional additional components, where that different inorganic metal compound is transformed into the inorganic metal compound of (i) during the process or in a MOML. Alternatively, a MOML can be formed by spin coating of, for example, a polymer solution that contains the inorganic metal containing compound and any other optional components.

A stacked OLED in accordance with the present disclosure is further described with reference to the following examples. The examples are merely for purposes of illustrating a stacked OLED and are not intended to be limiting embodiments thereof.

EXAMPLES

Figure 6:
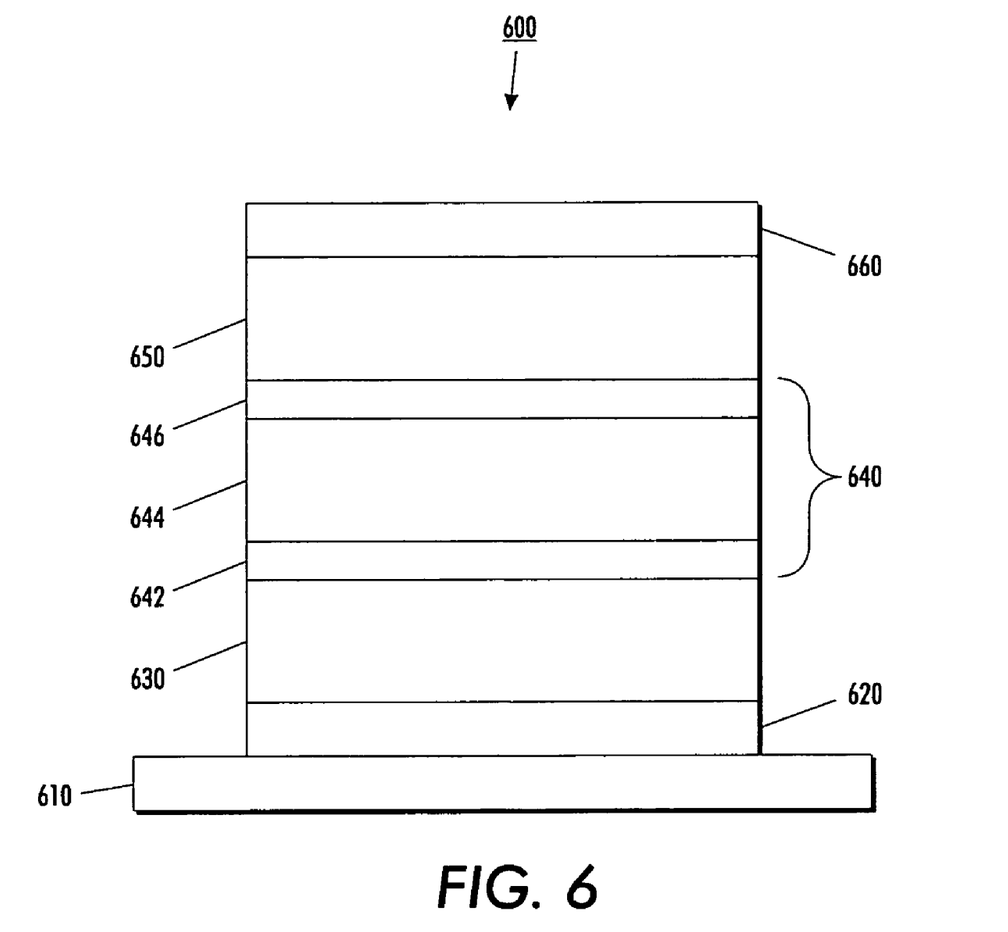
FIG. 6 is a schematic cross sectional view of the configuration of the stacked OLEDs of Examples I-III.

Stacked OLED devices I, II and III employing an intermediate electrode in accordance with the present disclosure were fabricated and had a general structure as shown in FIG. 6. As shown in FIG. 6, stacked OLED 600 includes a glass substrate 610, an ITO anode 620, luminescent region (1) 630, luminescent region (2) 650, cathode 660, and intermediate electrode 640 disposed between luminescent region (1) and luminescent region (2). Intermediate electrode 640 included MOML 644 disposed between electron injecting layer 642 and hole injecting layer 646. The devices were fabricated using physical vapor deposition in vacuum ($5 \times 10^{-6}$ Torr.) on ITO coated glass substrates, where the anode served as the bottom anode. The cathode 660 was a mixture of Mg and Ag. The composition and thickness of the luminescent regions and the various layers of the intermediate electrode are shown in Table 1.

The emission properties of the devices were evaluated by driving the devices at 25 mA/cm$^2$. The luminance, driving voltage for the devices are also shown in Table 1.

TABLE 1

| OLED No. | Luminescent Region (1) | Intermediate Electrode | | | | L (cd/m²) | V (V) |
|---|---|---|---|---|---|---|---|
| | | EIL | MOML | HIL | Luminescent Region (2) | | |
| I | NPB(60 nm)/AlQ3(75 nm) | Mg + Ag (9:1)(3 nm) | AlQ3 + Ag (80%:20%) (25 nm) | F₄-TCNQ (5 nm) | NPB(60 nm)/AlQ3(75 nm) | 750 | 14.59 |
| II | NPB(20 nm)/NPB + AlQ3 + 0.4% C545T(40 nm)/AlQ3 (20 nm) | LiF (1 nm) | AlQ3 + Ag (90%:10%) (50 nm) | NPB + F₄-TCNQ (9:1) (20 nm) | NPB(20 nm)/NPB + AlQ3 + 0.4% C545T(40 nm)/AlQ3(20 nm) | 2920 | 9.75 |
| III | NPB(20 nm)/NPB + AlQ3 + 0.5% C545T(80 nm)/AlQ3 (20 nm) | LiF (1 nm) | AlQ3 + Ag (90%:10%) (25 nm) | NPB + F₄-TCNQ (9:1) (20 nm) | NPB(20 nm)/NPB + AlQ3 + 0.5% C545T(80 nm)/AlQ3(20 nm) | 2710 | 13.86 |

As shown in Table 1, stacked OLEDs comprising an intermediate electrode that comprise an MOML exhibited very high brightness. Stability testing of the devices also showed that the devices can demonstrate high stability reflected in a half-life of several thousand hours.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A stacked OLED comprising:
   a first electrode;
   a second electrode;
   a plurality of luminescent regions disposed between the first and second electrodes; and two or more intermediate electrodes, the intermediate electrodes being disposed between successive luminescent regions, wherein each intermediate electrode is a metal-organic mixed layer electrode comprising a first charge injecting layer, a second charge injecting layer, and a metal-organic mixed layer disposed between the first and second charge injecting layers, wherein the first and second charge injecting layers have different charge injecting functions and wherein the metal-organic mixed layer comprises a metal material comprising a metal selected from the group consisting of Sc, Y, Ti, Zr, Hf, V, Nb, Ta, Cr, Mo, W, Mn, Tc, Ru, Os, Co, Rh, Ir, Ni, Pd, Pt, Cu, Ag, Au, Zn, Cd, Sn, Pb, Bi, Se, Te, Nd, and combinations thereof.

2. The stacked OLED according to claim 1, wherein the first and second charge injecting layers of the metal-organic mixed layer electrode are selected from the group consisting of a hole injecting layer and an electron injecting layer.

3. The stacked OLED according to claim 1, wherein the metal-organic mixed layer of the metal-organic mixed layer electrode independently comprises a metal material in an amount of from about 5 to about 95 percent by volume and an organic material in an amount of from about 5 to about 95 percent by volume.

4. The stacked OLED according to claim 1, wherein the metal-organic mixed layer of the metal-organic mixed layer electrode comprises a metal material in an amount of from about 5 to about 30 percent by volume and an organic material in an amount of from about 95 to about 70 percent by volume.

5. The stacked OLED according to claim 1, wherein the first charge injecting layer is an electron injecting layer and the second charge injecting layer is a hole injecting layer.

6. The stacked OLED according to claim 1, wherein each intermediate electrode comprises a hole injecting layer comprising an electron-accepting material selected from the group consisting of FeCl3, AlCl3, InCl3, GaCl3, SbCl5, trinitrofluorenone, 2,3,5,6-tetrafluoro-7,7,8,8-tetracyanoquinodimethane, and combinations thereof.

7. The stacked OLED according to claim 6, wherein the hole injecting layer further comprises a hole transport material selected from the group consisting of N,N'-di(naphthalene-1-yl)-N,N'-diphenyl-benzidine (NPB), 4,4',4"-tris(N,N-diphenylamino)triphenylamine (mTDATA), 2,5-di-tert-butylphenyl-N,N'-diphenyl-N,N'-bis(3-methylphenyl-(1,1'-biphenyl)-4,4'-diamine (BP-TPD), N,N'-diphenyl-N,N'-bis(3)methylphenyl-(1,1'-biphenyl)-4,4'-diamine (TPD), copper phthalocyanine (CuPc), vanadyl-phthalocyanine (VOPc), poly(3,4-ethylenedioxythiophene) (PEDOT), polyaniline (PAni), and combinations thereof.

8. The stacked OLED according to claim 1, wherein each intermediate electrode comprises an electron injecting layer comprising a material selected from the group consisting of Ca, Li, K, Na, Mg, Al, In, Y, Sr, Cs, Cr, Ba, Sc, Si and compounds thereof.

9. The stacked OLED according to claim 1, wherein the charge injecting layers independently have a thickness of from about 0.1 to about 50 nm.

10. The stacked OLED according to claim 1, wherein the metal-organic mixed layer of each of the intermediate electrodes independently has a thickness of from about 5 to about 100 nm.

11. The stacked OLED according to claim 1, wherein the two or more intermediate electrodes independently have a thickness of from about 5 to about 250 nm.

12. A display device comprising a stacked OLED according to claim 1.

13. A stacked OLED comprising:
   an anode;
   a cathode;
   a plurality of luminescent regions disposed between the anode and the cathode; and
   two or more intermediate electrodes, an intermediate electrode being disposed between successive luminescent regions, wherein each intermediate electrode independently comprises i) a hole injecting layer, ii) an electron injecting layer, and iii) a metal-organic mixed layer disposed between the hole injecting layer and the electron injecting layer, wherein the metal-organic mixed layer comprises a mixture of a metal and an organic material, the metal being selected from the group consisting of Sc, Y, Ti, Zr, Hf, V, Nb, Ta, Cr, Mo, W, Mn, Tc, Ru, Os, Co, Rh, Ir, Ni, Pd, Pt, Cu, Ag, Au, Zn, Cd, Sn, Pb, Bi, Se, Te, Nd, and combinations thereof.

14. The stacked OLED according to claim 13, wherein the hole injecting layer and the electron injecting layer each independently have a thickness of from about 0.1 to about 50 nm and the metal-organic mixed layer has a thickness of from about 5 to about 100 nm.

15. A display device comprising a stacked OLED according to claim 13.

* * * * *